United States Patent
Gopal et al.

(10) Patent No.: US 9,318,333 B2
(45) Date of Patent: Apr. 19, 2016

(54) DIELECTRIC EXTENSION TO MITIGATE SHORT CHANNEL EFFECTS

(75) Inventors: Vidyut Gopal, Saratoga, CA (US); Shankar Sinha, Redwood Shores, CA (US); Jean Yee-Mei Yang, Glendale, CA (US); Phillip L. Jones, Fremont, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 772 days.

(21) Appl. No.: 11/724,725

(22) Filed: Mar. 16, 2007

(65) Prior Publication Data

US 2008/0157199 A1    Jul. 3, 2008

Related U.S. Application Data

(60) Provisional application No. 60/877,300, filed on Dec. 27, 2006.

(51) Int. Cl.
| | | |
|---|---|---|
| H01L 21/336 | (2006.01) | |
| H01L 21/28 | (2006.01) | |
| H01L 21/311 | (2006.01) | |
| H01L 27/115 | (2006.01) | |
| H01L 29/66 | (2006.01) | |

(52) U.S. Cl.
CPC .... H01L 21/28123 (2013.01); H01L 21/31144 (2013.01); H01L 27/115 (2013.01); H01L 27/11568 (2013.01); H01L 29/6653 (2013.01)

(58) Field of Classification Search
CPC ............ H01L 21/02697; H01L 29/0603; H01L 29/0615; H01L 29/0657; H01L 29/0684
USPC .......... 257/E21.231, 346, 387, 282–283, 257/E21.433, E21.435, E21.507, 900, 257/E21.177–E21.184, E21.135, E21.19, 257/E21.537; 438/299–307, 180–185, 438/229–232, 320–321, 339, 364–377, 695, 438/701, 759, 591, 585–588, 595
See application file for complete search history.

(56) References Cited

U.S. PATENT DOCUMENTS

| | | | |
|---|---|---|---|
| 5,314,834 A | 5/1994 | Mazure et al. | |
| 5,866,448 A * | 2/1999 | Pradeep et al. | 438/231 |
| 6,312,994 B1 * | 11/2001 | Nakamura | 438/279 |
| 6,579,812 B2 * | 6/2003 | Chen | 438/780 |
| 6,660,598 B2 | 12/2003 | Hanafi et al. | |
| 6,818,507 B2 * | 11/2004 | Ueda | 438/257 |
| 6,841,831 B2 | 1/2005 | Hanafi et al. | |
| 7,972,962 B2 * | 7/2011 | Matsumoto et al. | 438/690 |
| 2003/0162358 A1 | 8/2003 | Hanafi et al. | |
| 2003/0211681 A1 | 11/2003 | Hanafi et al. | |
| 2004/0092072 A1 | 5/2004 | Kim | |
| 2006/0170016 A1 | 8/2006 | Mathew et al. | |
| 2008/0076214 A1 * | 3/2008 | Han et al. | 438/197 |

* cited by examiner

*Primary Examiner* — Colleen A Matthews
*Assistant Examiner* — Colleen E Snow (57) ABSTRACT

In patterning a transistor, some of a layer of gate dielectric material is allowed to remain over a semiconductor substrate upon which the transistor is formed. This remaining dielectric material retards the implantation of dopants into the underlying substrate, effectively lengthening a channel region of the transistor. This mitigates unwanted short channel effects, such as leakage currents, for example, and thus mitigates yield loss by establishing a transistor that performs in a more predictable or otherwise desirable manner.

12 Claims, 6 Drawing Sheets

DIELECTRIC EXTENSION TO MITIGATE SHORT CHANNEL EFFECTS

REFERENCE TO RELATED APPLICATION

This application claims the benefit of U.S. Provisional Patent Application Ser. No. 60/877,300 which was filed Dec. 27, 2006, entitled DIELECTRIC EXTENSION TO MITIGATE SHORT CHANNEL EFFECTS.

FIELD

The disclosure herein pertains to semiconductor fabrication, and more particularly to establishing a dielectric extension in a transistor to mitigate short channel effects.

BACKGROUND

It can be appreciated that many resources that go into producing semiconductor devices, including many man hours for designing the devices, sophisticated equipment for fabricating the devices and expensive materials from which the devices are formed, among other things. It can thus also be appreciated that there is an ongoing desire to mitigate yield loss, where yield generally relates to the number of acceptable units produced. For example, a high yield generally corresponds to a low number of defective units. Mitigating yield loss can translate into substantial savings. Moreover, since devices are continually being reduced in size, scrapping a portion of a semiconductor substrate generally involves throwing away a greater number of expensive devices, thus providing further incentive to mitigate yield loss.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

In patterning a transistor, some of a layer of gate dielectric material is allowed to remain over a semiconductor substrate upon which the transistor is formed. This remaining dielectric material retards the implantation of dopants into the underlying substrate, effectively lengthening a channel region of the transistor. This mitigates unwanted short channel effects, such as leakage currents, for example, and thus mitigates yield loss by establishing a transistor that performs in a more predictable or otherwise desirable manner.

To the accomplishment of the foregoing and related ends, the following description and annexed drawings set forth certain illustrative aspects. Other aspects, advantages and/or features may, however, become apparent from the following detailed description when considered in conjunction with the annexed drawings.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Figure 1:
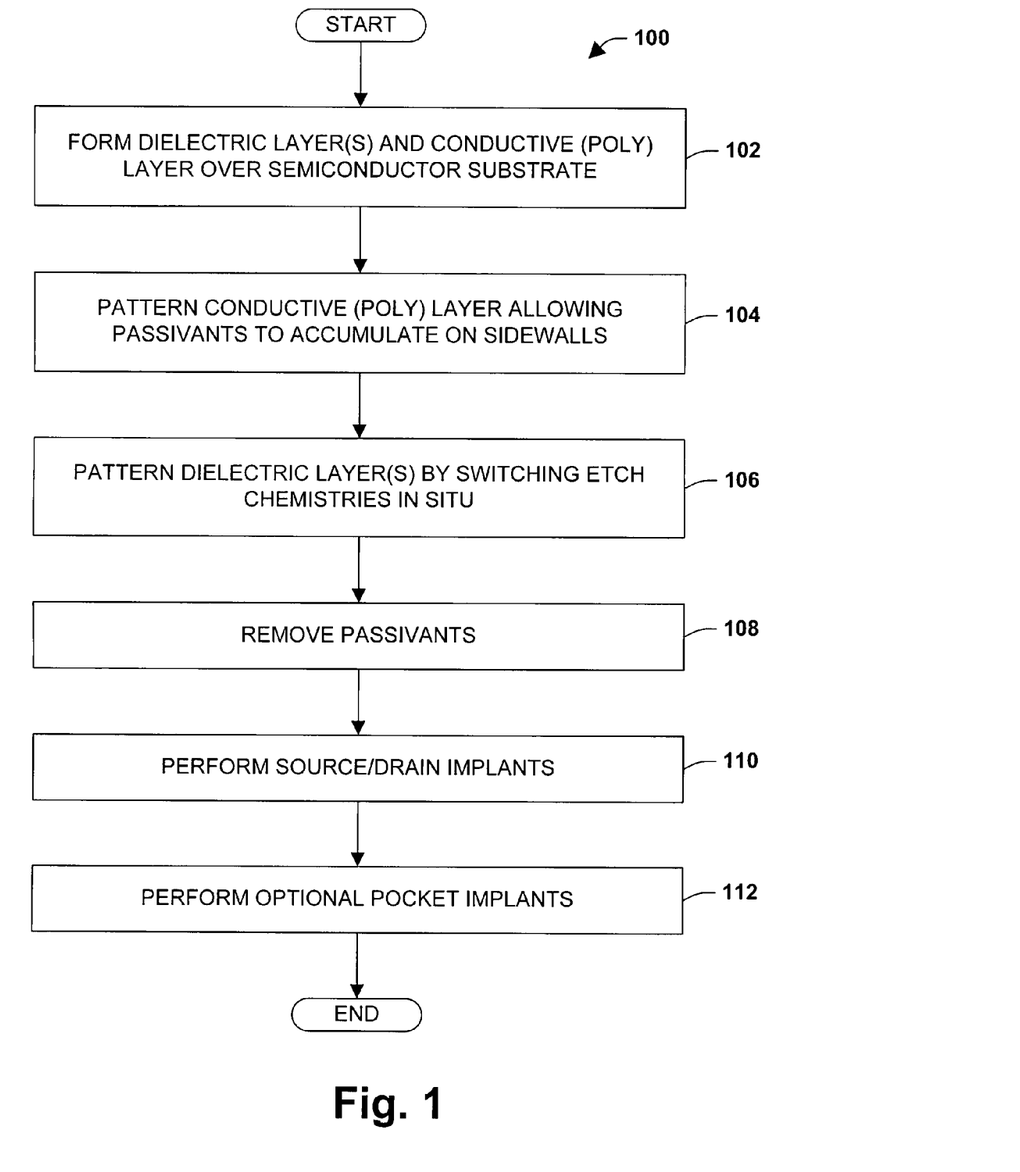
FIG. 1 is a flow diagram illustrating an example methodology for implementing a dielectric extension in transistor fabrication to mitigate short channel effects.

An example methodology 100 for implementing a dielectric extension in transistor fabrication to mitigate short channel effects is illustrated in FIG. 1, and an example semiconductor substrate 200 whereon such a methodology is implemented is illustrated in cross-sectional view in FIGS. 2-7. While the method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
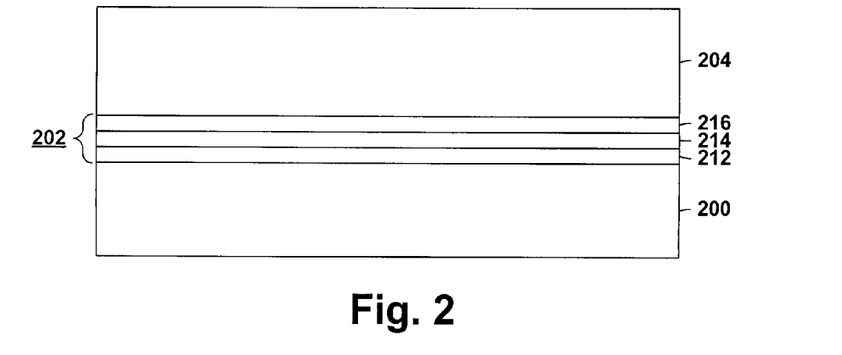
FIGS. 2-7 are cross-sectional views of an example semiconductor substrate whereon an example transistor is formed with a dielectric extension to mitigate short channel effects.

At 102, a layer of gate dielectric material 202 is formed over the semiconductor substrate 200 and a layer of gate electrode material 204 is formed over the layer of gate dielectric material 202 (FIG. 2). The layer of gate dielectric material 202 may be referred to as a charge-trapping dielectric layer since charge (e.g., electrons) can be trapped therein. The charge-trapping dielectric layer 202 generally comprises a first insulating layer 212, a charge-trapping layer 214, and a second insulating layer 216. The first 212 and second 216 insulating layers generally comprise a dielectric material, such as silicon dioxide ($SiO_2$), and the charge-trapping layer 214 generally comprises another dielectric material, such as silicon nitride ($Si_xN_y$). This oxide-nitride-oxide configuration may also be referred to as an ONO layer, and can be formed to a thickness of between about 5 nm and about 20 nm, for example. The layer of gate electrode material 204 generally comprises a polysilicon (or other semiconductor) based material, and is formed to a thickness of between about 20 nm and about 100 nm, for example.

Figure 3:
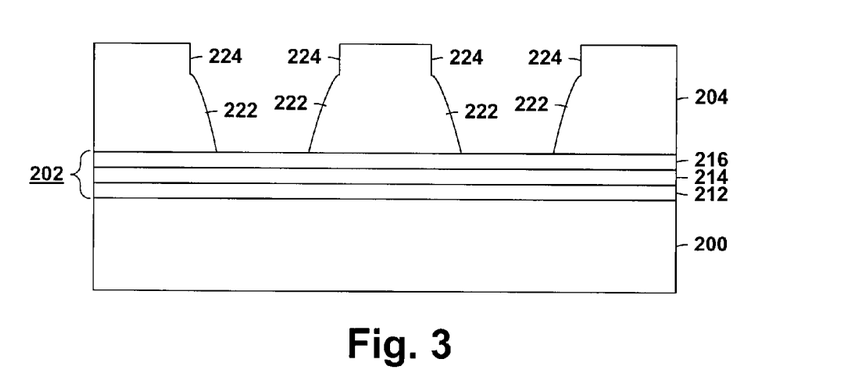

The layer of gate electrode material 204 is then patterned at 104 to selectively reveal some of the charge trapping dielectric layer 202 (FIG. 3). It will be appreciated that this, as well as other patterning described herein, can be performed with lithographic techniques, where lithography refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched).

In the illustrated example, a resist (not shown) can thus be formed and patterned over the layer of gate electrode material 204, where the pattern formed in the resist can then be transferred to layer 204. Alternatively, a layer of hardmask material, such as a nitride based material, for example, (not shown) may be formed over the layer of gate electrode material 204. A resist (not shown) could then be formed and patterned over the layer of hardmask material, and the pattern transferred from the resist to the hardmask, and then from the hardmask to the layer of gate electrode material 204 (e.g., after the patterned resist is removed). In some instances, the hardmask may provide increased fidelity as the resist may be affected (at least more so than the hardmask) by subsequent etching processes It will be appreciated that as the layer of gate electrode material 204 is patterned (e.g., etched) byproducts 222 of the process may accumulate on the sidewalls 224 of layer 204. Such byproducts 222 are at times referred to as passivants or polymers (since they generally comprise some of the polysilicon from layer 204).

Figure 4:
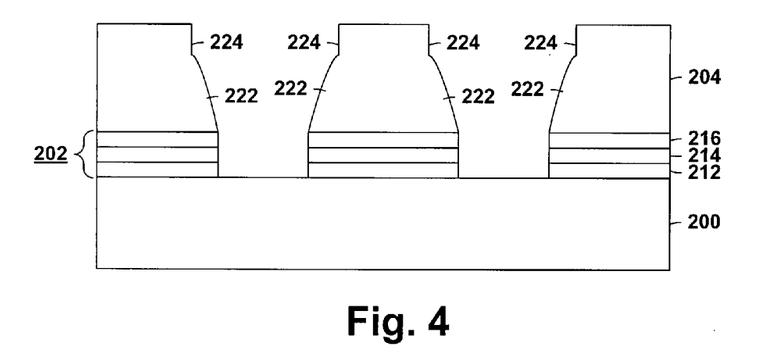

At 106, the layer of gate dielectric material 202 is patterned to selectively reveal portions of the substrate 200 (FIG. 4). This patterning can be thought of as a continuation of or at least consecutively to the patterning performed at 104, where the etch chemistry is merely adjusted in situ to remove layer 202 rather than layer 204. That is, the patterning can occur in a single etching chamber where a first etching composition is used to pattern layer 204 and then is switched in situ to a second etching composition to pattern layer 202. This can be accomplished, for example, by merely adjusting the (volume, flow rate, composition, etc. of) gases administered in the etching chamber. It can be seen that the passivants 222 inhibit patterning of the underlying layer of gate dielectric material 202. As will be appreciated, this results in dielectric extensions that facilitate mitigation of short channel effects.

Figure 5:
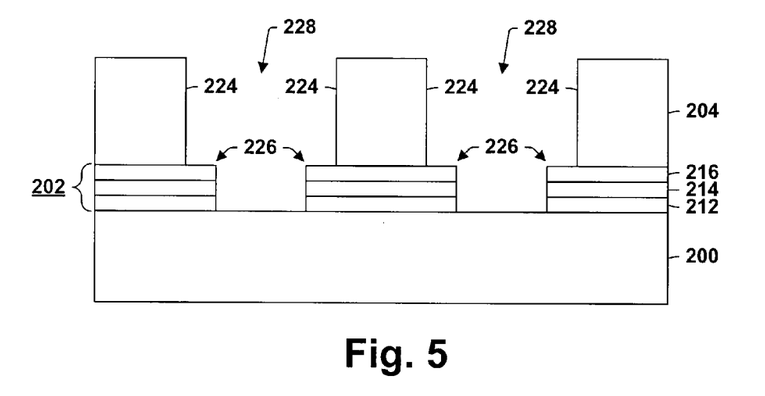

At 108, the passivants 222 are removed from the sidewalls 224 of the patterned gate electrode layer 204 (FIG. 5). This may be accomplished with a wet clean of ammonium hydroxide and hydrogen peroxide (this mixture at times being referred to as APM). As can be seen, portions 226 of the layer of gate dielectric material 202 that were protected by the passivants 222 extend out into the apertures 228 created by the patterning performed at 104 and 106.

Figure 6:
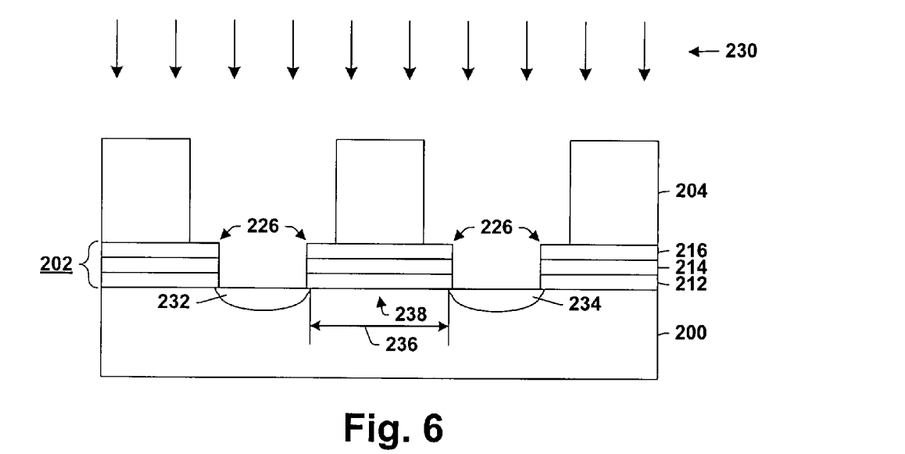

With the passivants removed, an implantation process 230 is performed at 110 to form source 232 and drain 234 regions in the substrate 200 (FIG. 6). In particular, p (e.g., boron) and/or n (e.g., phosphorous, arsenic, antimony) type dopant atoms are implanted into the substrate depending upon the type of transistor (e.g., PMOS, NMOS) being formed. It can be appreciated that some of the dopants may also be implanted into the top of the gate electrode 204 during the implantation at 110. It can also be appreciated that the dielectric extensions 226 impede the implantation of dopants into the substrate 200 such that the source 232 and drain 234 regions are substantially aligned with the extensions 226. This effectively increases the length 236 of a channel region 238 defined in the substrate 200 between the source 232 and drain 234 regions.

Figure 7:
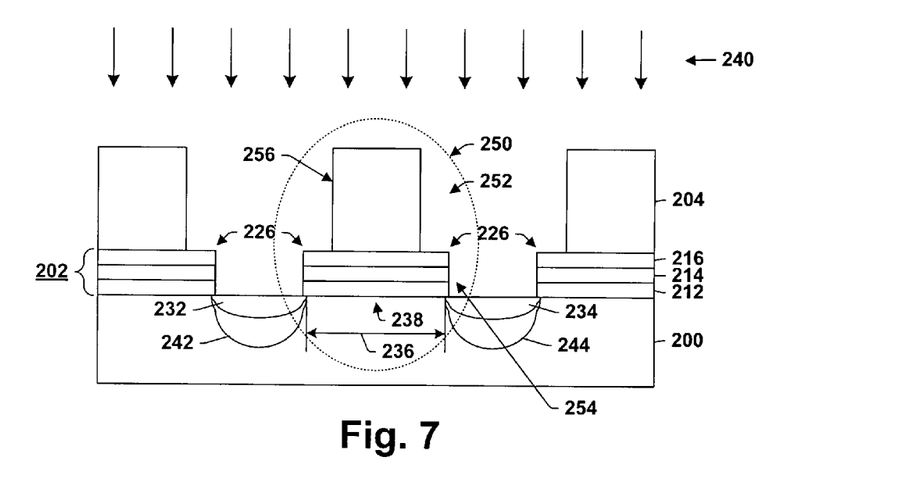

An optional second implantation process 240 is performed at 112 to form pocket regions 242, 244 in the substrate 200. The second implantation 240 is generally performed at a higher energy than the first implantation 230 such that the pocket regions 242, 244 are formed somewhat deeper in the substrate 200 than the source 232 and drain 234 regions (FIG. 7). Like the source 232 and drain 234 regions, however, p (e.g., boron) and/or n (e.g., phosphorous, arsenic, antimony) type dopant atoms can be implanted into the substrate 200 depending upon the type of transistor (e.g., PMOS, NMOS) being formed. Thereafter, back end processing can be performed, wherein one or more anneals can be performed to "activate" dopant atoms, for example, and/or one or more layers of conductive, semi-conductive and/or dielectric materials can be formed and patterned as needed.

A transistor 250 is thus defined in/on the substrate 200 that comprises source 232 and drain 234 regions, pocket regions 242, 244, a channel region 238 defined between the source 232 and drain 234 regions and a gate structure or stack 252 which comprises a section 254 of the patterned layer of gate dielectric material 202 and a section 256 of the patterned layer of gate electrode material 204. Dielectric extensions 226 stick out from the gate structure or stack 252. That is, the section 254 of the patterned layer gate dielectric material 202 has a width that is greater than a width of the section 256 of the patterned layer of gate electrode material 204.

Figure 8:
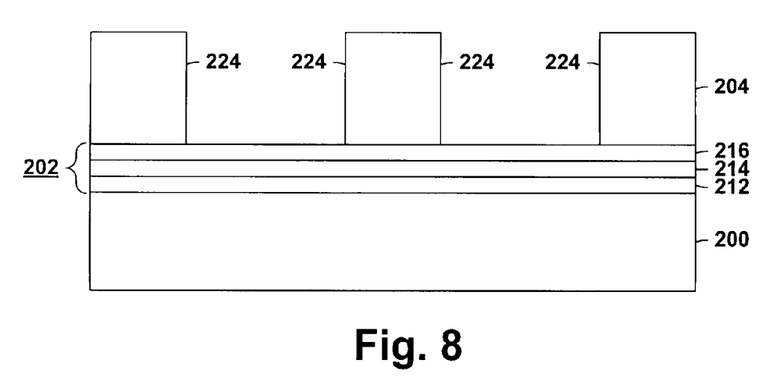
FIGS. 8 and 9 are cross-sectional views of an example semiconductor substrate whereon an example transistor is not formed with a dielectric extension, and thus has a shorter channel.
Figure 9:
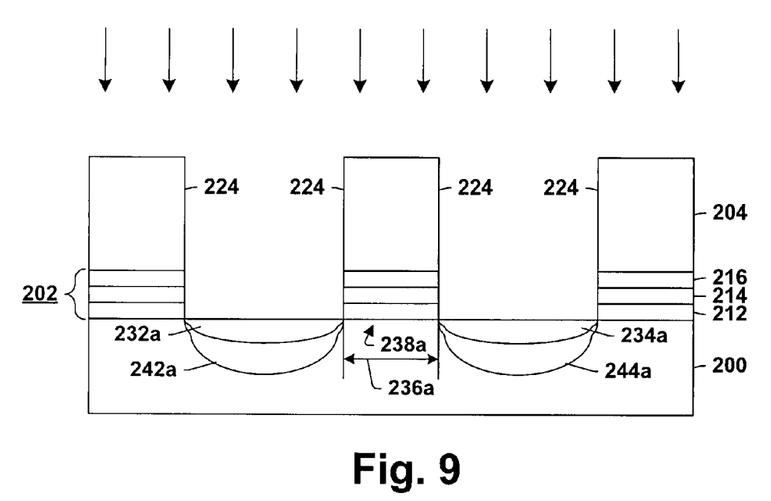

FIGS. 8 and 9 illustrate transistor formation without the dielectric extensions 226. In such a process, the passivants 222 (FIG. 4) are removed from the sidewalls 224 of the gate electrode 204 (e.g., via a wet etch) before the gate dielectric 202 is patterned (FIG. 8). In the absence of the passivants 222, the dielectric extensions 226 (FIG. 5) do not remain when the layer of gate dielectric material 202 is patterned (FIG. 9). Accordingly, implanted dopant atoms are not inhibited thereby in forming the source 232a, drain 234a and pocket 242a, 244a regions. The channel region 238a defined between the source 232a and drain 234a regions thus has a length 236a that is shorter than the length 236 of the channel 238 established when the dielectric extensions 226 are implemented (FIG. 7).

It can be appreciated that the longer channel length 236 established with the dielectric extensions 226 is desirable because it mitigates short channel effects, such as leakage currents, for example, that can (undesirably) develop between the source 232 and drain 234 regions. Such short channel effects may make a resulting transistor operate in an unpredictable or otherwise undesirable manner, such that the device may have to be discarded—thus promoting yield loss. As such, implementing the dielectric extensions 226 as described herein allows resulting transistors to perform in a more predictable or otherwise desirable manner, thereby mitigating yield loss. Additionally, the fabrication process is streamlined since a wet clean does not have to be performed to remove the passivants before the layer of gate dielectric material 202 is patterned. Similarly, fewer etching acts are required since the layer of gate electrode material 204 and the layer of gate dielectric material 202 are patterned in a single action by merely adjusting the etch chemistry of the process in situ.

Figure 10:
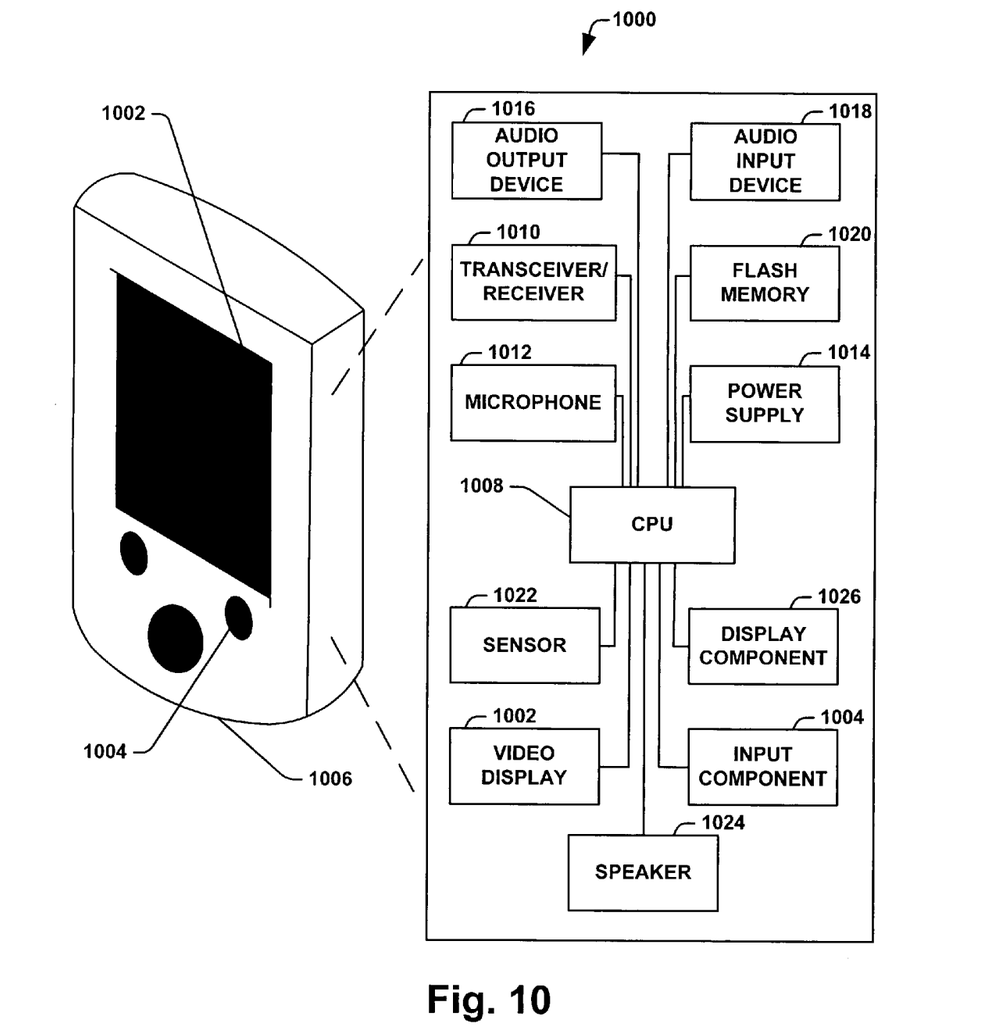
FIG. 10 is a schematic diagram of an electronic device where one or more aspects of the disclosure herein may be implemented.

FIG. 10 illustrates an example of a (portable) electronic device, such as a communication device or Personal Data Assistant (PDA) 1000, for example, where one or more aspects of the disclosure herein may be implemented. The communication device 1000 comprises a video display 1002, one or more user input components 1004, a housing 1006, a CPU 1008, a transceiver and/or receiver 1010, a microphone 1012, a power supply 1014, an audio output device 1016, an audio input 1018, memory 1020, various sensors 1022, and speaker(s) 1024. The memory 1020 and/or CPU 1008 of the communication device 1000 may comprise, for example, a transistor as described herein. The one or more user input components 1004 can include a keypad, buttons, dials, pressure keys, and the like. The video display 1002 can be a liquid crystal display, a plasma display, an LED display, and the like, for visually displaying information. The CPU 1008 can be configured to communicate with the audio input device 1018, the audio output device 1016 and a display component 1026. The display component 1026 can be separate and distinct from the video display 1002. The CPU 1008 can execute control functions based on inputs from the user, entered using the one or more user input components 1004, for example. Based on those inputs, for example the display component can display a graph, a photo, a map, a chart, a video, and the like. The communication device 1000 can also be configured to output data as an audio signal, for example a song, a message, a warning sound, various tones, recordings, etc. The communication device 1000 can be configured to communicate with other electronic devices, for example computers, cell phones, other PDAs, and the like. The communication device 1000 can also be configured to (wirelessly) transmit and/or receive data. This is done utilizing the transmitter/receiver 1010 to either transmit or receive data. Additionally, sensors 1022 can be utilized to sense data external to the PDA 1000, for example, temperatures, radiation levels, pressures, and the like. It will be appreciated that a voltage regulator as described herein can similarly be implemented in cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like.

It will be appreciated that, substrate and/or semiconductor substrate as used herein may comprise any type of semiconductor body (e.g., silicon, SiGe, SOI) such as a semiconductor wafer and/or one or more die on a wafer, as well as any other type of semiconductor and/or epitaxial layers associated therewith. Also, while reference is made throughout this document to exemplary structures in discussing aspects of methodologies described herein (e.g., those structures presented in FIGS. 2-7 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method comprising:
   patterning a layer of gate electrode material such that apertures are created in the layer of gate electrode material and passivants accumulate on sidewalls of the apertures, wherein the patterning uses a first etching composition;
   patterning a layer of gate dielectric material to form openings in the layer of gate dielectric material, wherein the patterning the layer of gate dielectric material leaves behind a portion of the passivants accumulated on the sidewalls of the apertures;
   removing at least some of the portion of the passivants accumulated on the sidewalls to create dielectric extensions that extend out into the apertures, wherein the removing the at least some of the portion of the passivants creates dielectric extensions that are configured to retard implantation of dopants into a substrate; and
   implanting dopants into a substrate that underlies the layer of gate dielectric material to establish source/drain regions in the substrate, wherein the source/drain regions each have a length that is approximately equal to a distance between adjacent openings in the layer of gate dielectric material so as to have an effect of lengthening a channel of a semiconductor device and mitigating a short channel effect experienced by the semiconductor device.

2. The method of claim 1, wherein the at least some of the portion of the passivants accumulated on the sidewalls are removed with a wet clean.

3. The method of claim 2, further comprising:
   implanting dopants into the substrate to establish pocket regions under the source/drain regions.

4. The method of claim 2, further comprising:
   forming a layer of hardmask material over the layer of gate electrode material;
   patterning the layer of hardmask material; and
   patterning the layer of gate electrode material with the patterned layer of hardmask material serving as a mask.

5. The method of claim 2, further comprising:
   performing an anneal to activate the dopants.

6. The method of claim 1, wherein the at least some of the portion of the passivants accumulated on the sidewalls are removed with a mixture of ammonium hydroxide and hydrogen peroxide.

7. The method of claim 1, further comprising:
   implanting dopants into the substrate to establish pocket regions under the source/drain regions.

8. The method of claim 7, further comprising:
   forming a layer of hard mask material over the layer of gate electrode material;
   patterning the layer of hardmask material; and
   patterning the layer of gate electrode material with the patterned layer of hardmask material serving as a mask.

9. The method of claim 8, further comprising:
   performing an anneal to activate the dopants.

10. The method of claim 1, further comprising:
    forming a layer of hard mask material over the layer of gate electrode material;
    patterning the layer of hard mask material; and
    patterning the layer of gate electrode material with the patterned layer of hardmask material serving as a mask.

11. The method of claim 1, further comprising:
performing an anneal to activate the dopants.

12. The method of claim 1, further comprising:
switching the first etching composition in situ to a second etching composition, wherein patterning comprises:
patterning the layer of gate dielectric material using the second etching composition.

\* \* \* \* \*